United States Patent
Shen et al.

(10) Patent No.: US 6,486,067 B1
(45) Date of Patent: Nov. 26, 2002

(54) METHOD FOR IMPROVING THE ELECTRICAL ISOLATION BETWEEN THE CONTACT AND GATE IN A SELF-ALIGNED CONTACT MOSFET DEVICE STRUCTURE

(75) Inventors: Yun-Hung Shen, Taipei (TW); Hsueh-Heng Liu, Kao-Hsiung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/429,670

(22) Filed: Oct. 29, 1999

(51) Int. Cl.[7] ............... H01L 21/302; H01L 21/461
(52) U.S. Cl. ............... 438/704; 438/233; 438/400; 438/739; 438/755
(58) Field of Search ............... 438/233, 299, 438/400, 704, 733, 739, 745, 754, 755

(56) References Cited

U.S. PATENT DOCUMENTS

| | | | |
|---|---|---|---|
| 5,480,814 A | | 1/1996 | Wuu et al. ............. 437/41 |
| 5,545,578 A | * | 8/1996 | Park et al. ............. 438/303 |
| 5,776,822 A | * | 7/1998 | Fujii et al. ............. 438/586 |
| 5,795,827 A | | 8/1998 | Liaw et al. ............. 438/663 |
| 5,899,722 A | | 5/1999 | Huang ............. 438/305 |
| 5,923,988 A | | 7/1999 | Cheng et al. ............. 438/305 |
| 5,989,987 A | * | 11/1999 | Kuo ............. 438/592 |

FOREIGN PATENT DOCUMENTS

| | | | |
|---|---|---|---|
| JP | 2-54960 A | * | 2/1990 |
| JP | 3-209775 A | * | 9/1991 |

* cited by examiner

Primary Examiner—Carl Whitehead, Jr.
Assistant Examiner—Jamie L. Brophy
(74) Attorney, Agent, or Firm—George O. Saile; Stephen B. Ackerman; Wolmar J Stoffel

(57) ABSTRACT

A method for fabricating a polycide self aligned contact for MOSFET devices in which the electrical isolation between the source/drain contact and gate structure is improved. In the method a gate insulator layer, a polysilicon layer, a metal silicide layer and an insulating layer are deposited on a semiconductor substrate. The insulator layer is patterned and anisotropically etched to expose the underlying metal silicide layer. The metal silicide layer is then dip etched to form an undercut beneath the insulating layer. The metal silicide and polysilicon layers are patterned with an anisotropic etch, dopants introduced into the opening to form lightly doped source/drain regions, and sidewall spacers formed on the sidewalls of the etched layers. After a dopant is introduced to form heavily doped source/drain regions, a contact structure is formed in the opening defined by the sidewall spacers.

14 Claims, 4 Drawing Sheets

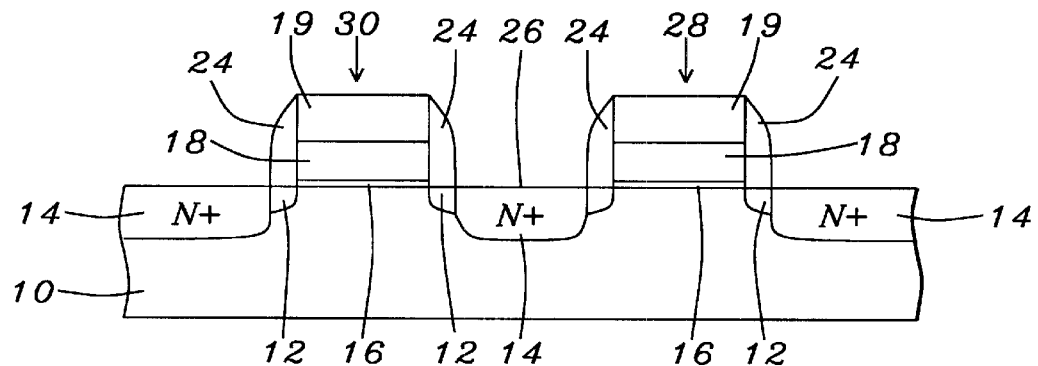
FIG. 1 - Prior Art
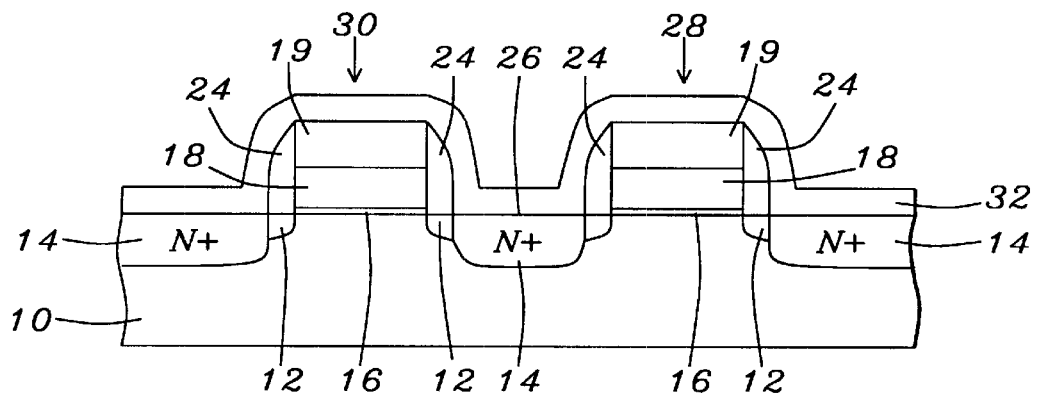
FIG. 2 - Prior Art
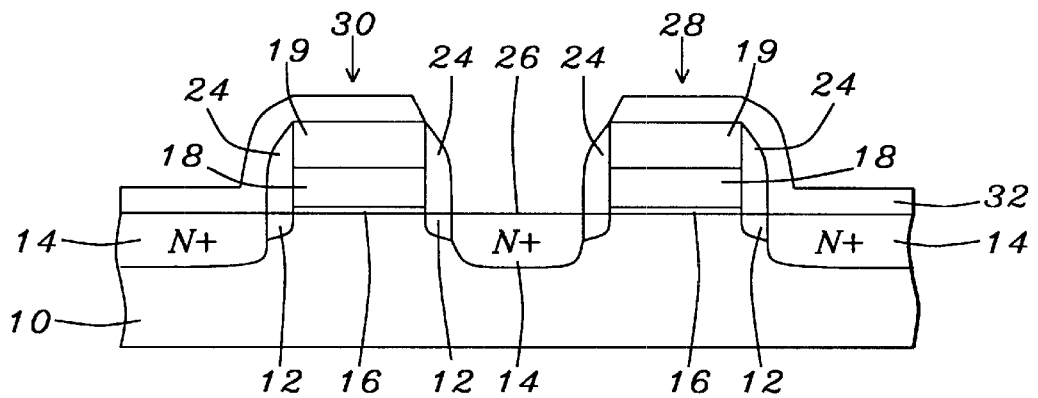
FIG. 3 - Prior Art

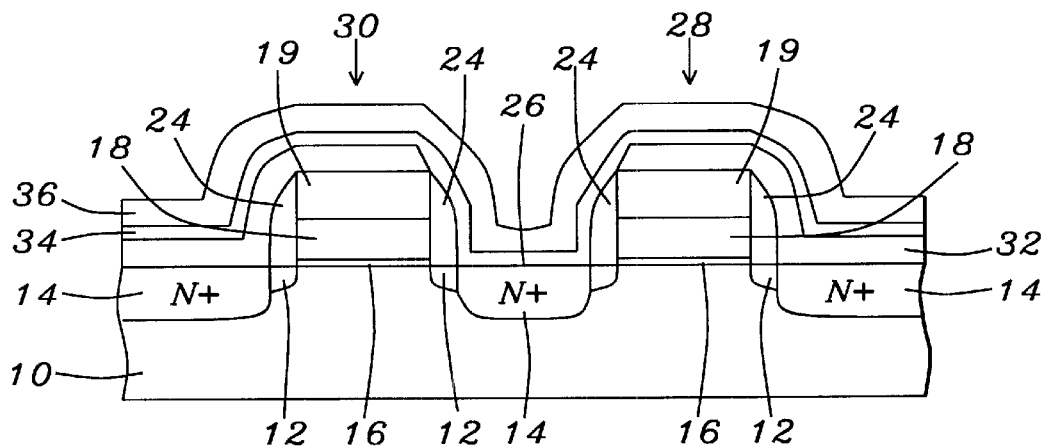
FIG. 4 – Prior Art
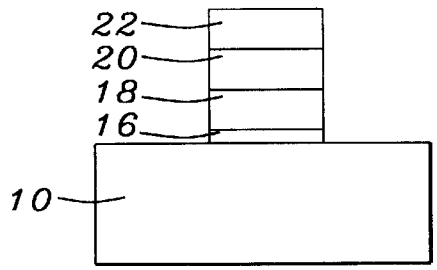
FIG. 5A – Prior Art
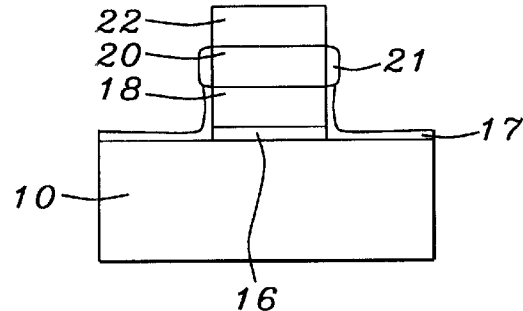
FIG. 5B – Prior Art
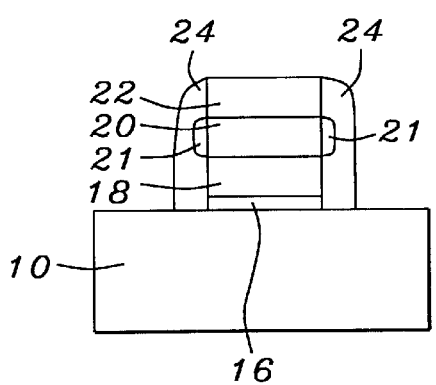
FIG. 5C – Prior Art
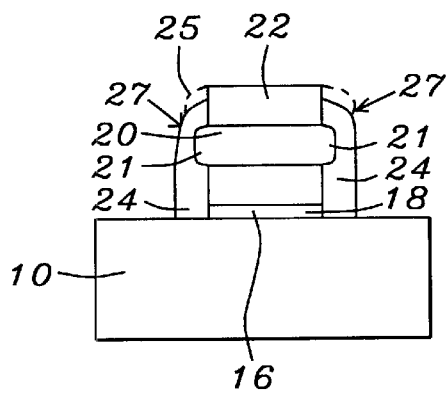
FIG. 5D – Prior Art

US 6,486,067 B1

METHOD FOR IMPROVING THE ELECTRICAL ISOLATION BETWEEN THE CONTACT AND GATE IN A SELF-ALIGNED CONTACT MOSFET DEVICE STRUCTURE

BACKGROUND OF THE INVENTION (1) Field of the Invention

The present invention relates to processes used to fabricate semiconductor devices, and more specifically to a process used to fabricate a self-aligned contact structure, where one of the components of the self-aligned contact structure is a metal silicide layer.

(2) Description of the Prior art

In semiconductor integrated circuit manufacturing, metals are formed into patterned layers to make electrical connections to and between individual devices on a silicon substrate, such as sources, drains, and gates of field effect transistors (FET's). Metal layers, dielectric layers, and other structures, such as gate structures may be deposited over the substrate. In the simplest method, a surface is blanketed with metal and the deposited metal is then patterned to form the desired interconnection configuration. In the current semiconductor processes, aluminum is the most widely used material, but other refractory materials are being used, tungsten in particular. Blanket layers of metal can be deposited by low pressure chemical vapor deposition (LPCVD) and the patterning of metal layers can be accomplished by conventional lithographic and etching techniques.

To form more accurate contacts between buried devices in the substrate, such as source and drain impurity regions, a method of forming self aligned contacts (SAC) is often used. A self aligned contact is formed by patterning layers of structures around a contact area so that when a metal layer is formed over the structures and the contact region, the metal forms an electrical connection with the impurity regions in the substrate, e.g. a source or drain region. However, self aligned contacts often suffer from several problems., such as poor metal contact with the substrate and also because of poor electrical isolation between the contact and the gate electrode.

A conventional process for forming a self aligned contact with a metal layer is shown in FIGS. 1 through 4. As shown in FIG. 1, gate structures 28, and 30 are formed on a semiconductor substrate 10 using conventional processes which are commonly known to those skilled in the art. Therefore only the elements will be described, not the processes. The gate structures 28, 30 are comprised of gate oxide layer 16, gate 18, top oxide layer 19 (also referred to as self aligned contact oxide layer), and oxide sidewall spacers 24. The substrate 10 has two silicon substrate diffusions, a N− diffusion (referred to as a lightly doped source or drain) 12 and a N+ diffusion (referred to as a heavily doped source or drain) 14.

Referring to FIG. 2, an inter-poly oxide layer 32 is formed on the device surface. The term "device surface" is used herein to include all layers and structures formed on the substrate. Next, portions of the inter-poly oxide 32 between the gate structures 28, 30 are etched (called a self-aligned contact etch) to expose the oxide sidewalls 24 and the contact area 26, as illustrated in FIG. 3.

Subsequently, a polysilicon layer 34 is formed with a thickness in the range of 500 to 600 angstroms on the device surface, as illustrated in FIG. 4. The polysilicon layer 34 is then implanted with impurity ions to increase its conductivity. Polysilicon layer 34 is deposited between the metal layer 36 and the oxide layers 24, 32 to prevent the pealing of the metal layer 34 from the device surface. A metal layer 36, preferably tungsten silicide, is formed over the polysilicon layer 34. The tungsten silicide layer 36 forms an electrical connection with the substrate and the underlying source/drain region 12, 14 in the contact area 26. This process is self aligning since the tungsten silicide connections contacts 26 to the source/drain diffusion 12, 14 are defined using the oxide sidewall spacers 24 as the mask. This self aligning contact process eliminates less precise and more costly lithography process steps.

There are numerous patents that describe self aligned contact structure and suggest various improvements thereto. U.S. Pat. Nos. 5,480,814 and 5,795,827 describe processes for reducing the contact resistance to the source/drain regions. U.S. Pat. No. 5,923,988 describes and claims a process for forming an improved self aligned contact which employs various reactants for forming tungsten silicide layers combined with a dual anneal to improve the contact. U.S. Pat. No. 5,899,722 describes a process for forming a SAC which used a dual spacer structure.

SUMMARY OF THE INVENTION

It is an object of the present invention to provide an method to for forming a self aligned contact with an improved electrical isolation between the self aligned contact and the gate electrode.

Another object of the invention is to provide a more electrically stable SAC contact.

An object of the invention is to provide an improved integrated circuit device which includes a self aligned contact between two gate structures on a semiconductor In accordance with the above objectives, there is provided an improved method of fabricating a polycide self aligned contact structure for MOSFET devices on a semiconductor substrate in which the electrical isolation between the contact and the gate structure is greatly improved. In the process a first polysilicon layer is formed on the substrate, followed by a first metal silicide layer, and a first insulator layer. The top first insulator layer is patterned anisotropically to form openings that define gate structures. The exposed metal silicide layer is dip etched in an etchant for metal silicide to form an undercut beneath the overlying peripheral edge of the first insulator layer. The anisotropic patterning is continued through metal silicide layer and the underlying first polysilicon layer. A first conductivity imparting dopant is implanted to form lightly doped source and drain regions. A second insulator layer is deposited on the surface and into the openings, including into the undercuts formed during the dip etch. The second insulator layer is anisotropically etched to form sidewall spacers in the openings. A second implant is made forming heavily doped source and drain regions. The conventional metal silicide contacts, and an interconnect metallization structure are thereafter formed.

BRIEF DESCRIPTION OF THE DRAWINGS

The objects and other advantages of this invention are best described in the preferred embodiment with reference to the attached drawings that include:

FIGS. 1 through 4 show the conventional process for forming a self aligned metal contact.

FIGS. 5A through 5D depict electrical isolation problems prevalent in self aligned contact structure produced in accordance with prior art fabrication techniques.

DESCRIPTION OF PREFERRED EMBODIMENTS

Figure 6:
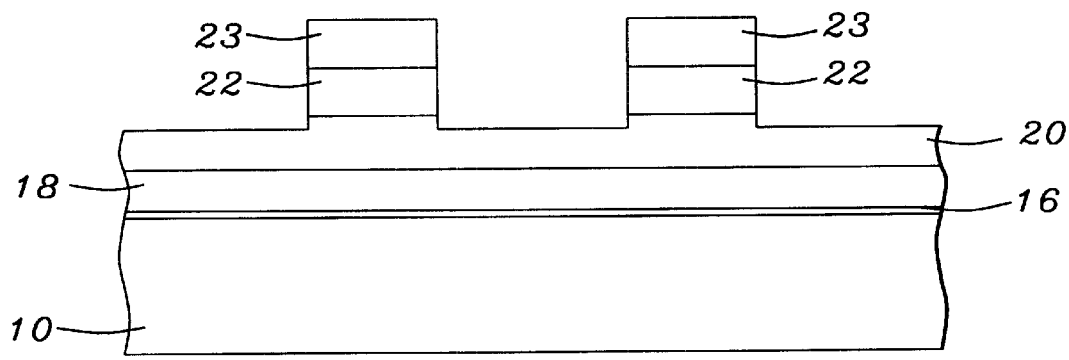
FIGS. 6 through 9 depicts cross sectional views that illustrate the process of the invention.

Referred now to the Figures. Of the drawing, and in FIG. 5A–D in particular, there is illustrated the electrical isolation problems of SAC structure produced by conventional fabrication techniques. As shown in FIG. 5A, the basic FET contact structure is shown which is produced by depositing a gate oxide layer 16, a polysilicon layer, a first polysilicon layer 18, a metal silicide layer 20, typically tungsten silicide, and a first insulator layer, typically silicon oxide, on a semiconductor substrate 10. The aforedescribed layers, all deposited by conventional techniques are then patterned using conventional masking and anisotropic etching techniques. This produces a structure depicted in FIG. 5A. When the contact structure is subjected to the normal pre-implant oxidation step to form oxide layer 17 on the substrate 10 surface, the edges of polysilicon layer 18 are oxidized, and also the edges of tungsten silicide layer 20. This oxidation results in a thickened layer portion 21 of electrically conductive tungsten silicon that protrudes beyond the original surface of layer 20, as shown in FIG. 5B. Thickened layer portion 21 will typically have a conductivity of 30 $\mu$ ohm-cm, and a thickness in the range of 800–1200 Angstrom, following a normal pre-implant oxidation step.

When the sidewall spacers 24 are added, by depositing an insulating layer and anistropically etching, the result is depicted in FIG. 5C. Note that the horizontal thickness of spacer 24 is diminished at layer 20. In the normal fabrication procedure, another layer of silicon oxide is deposited on the surface of the device and a self aligned contact opening is made. This etching removes additional material from the top portions of sidewalls 24, which further reduces the thickness of sidewalls 24, as illustrated by dotted lines 25 in FIG. 5D. The reduced thickness of spacer 24, in the region of the metal silicide gate contact 20, increases the potential for shorting when the source/drain contact (not shown) is formed.

Figure 7:
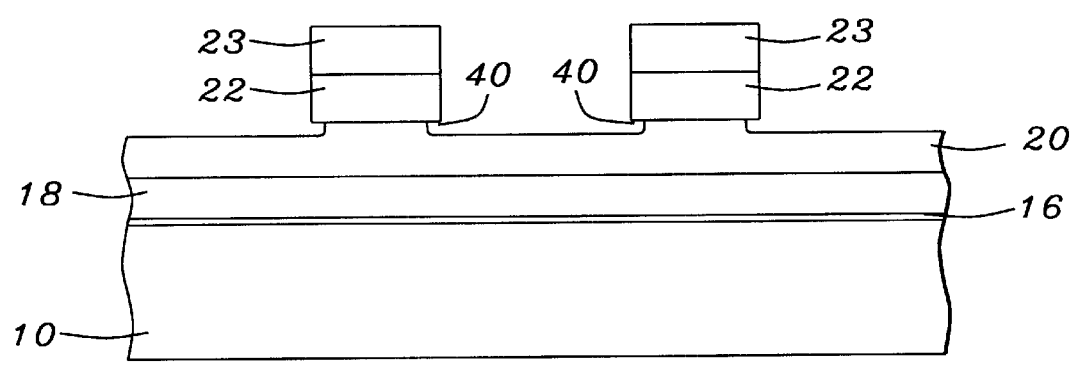
Figure 8:
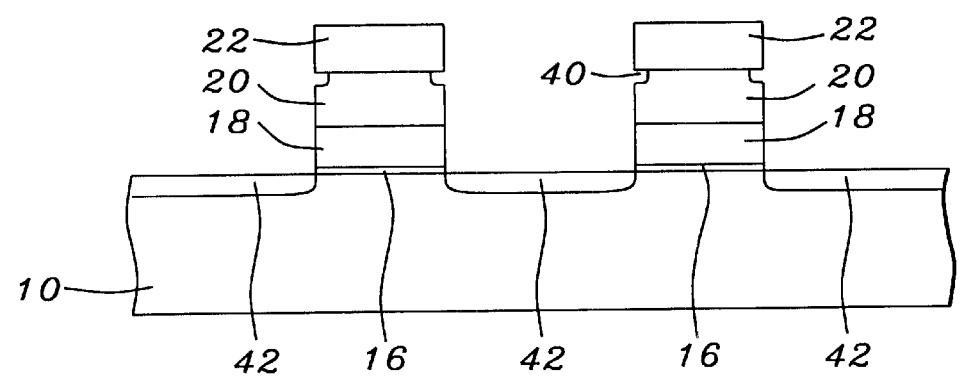
Figure 9:
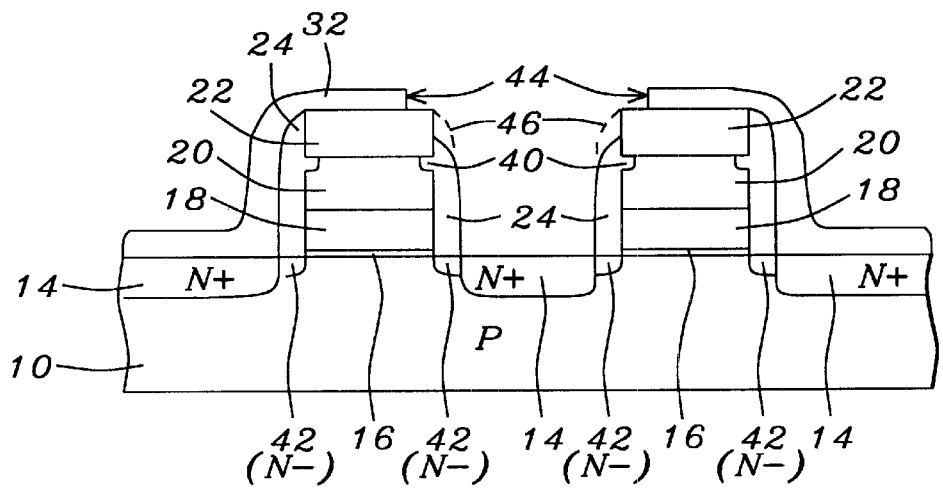
Figure 10:
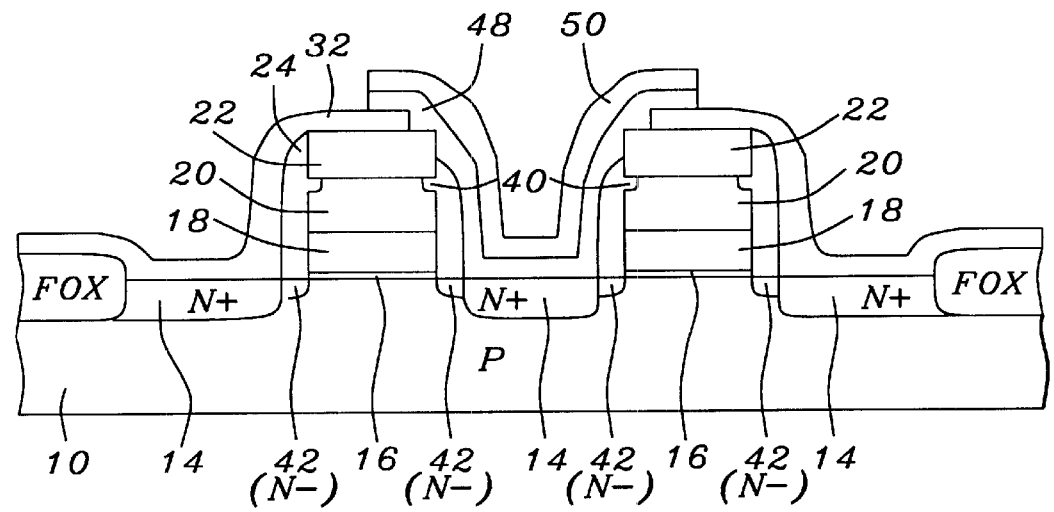
FIG. 10 depicts a completed SAC structure produced by the method of the invention.

Referring now to FIGS. 6–10, the method of the invention for fabricating SAC structures having improved electrical isolation will be described. In FIG. 6 there is shown a semiconductor substrate 10 having a gate insulator layer 16, a first polysilicon layer 18, a first metal silicide layer 20, preferably of tungsten silicide, and a first insulator layer 22, typically of silicon nitride. The metal silicide layer 20 will typically have a preferred thickness in the range of 1000–1200 Angstrom, and is deposited using LPCVD procedures at a temperature between 400 to 600 degrees C., using silane and tungsten hexafluoride as a source. The thickness of layer 20 can vary between 750 and 1500 angstroms. The first insulator layer 22 will typically have a thickness in the range of 2000–3000 Angstrom. Normally field oxide regions (not shown) are formed to provide electrical isolation of the individual elements. This structure is well known and will not be described. The field oxide regions are illustrated in FIG. 10 however. After the various layers have been formed, a photoresist layer 23 is deposited, exposed and developed to define the desired metallurgy configuration. As shown in FIG. 6, the first insulator layer 22 is anisotropically etched to expose the top surface of metal silicide layer 20. As indicated in FIG. 7. The metal silicide layer 20 is dip etched in an etchant for metal silicide so that an undercut 40 is formed beneath the edge of first insulating layer 22. Any suitable etchant can be used. However, a preferred etchant for tungsten silicide consists of 1 part $NH_4OH$, 1 part $H_2O_2$, and 5 parts $H_2O$, by volume. The etchant can be applied at a temperature in the range of 25 to 35 degrees C., more preferably at room temperature, for a time in the range of 20 to 25 minutes. Preferably the undercut 40 extends beneath the edge of layer 22 a distance in the range of 200 to 350 Angstrom.

As indicated in FIG. 8, the remaining layers 20, 18, and 16 are patterned by anisotropic ion etching to complete the gate structures. As is well known, anisotropic etching results in openings that have vertical sidewalls and is achieved by ion bombardment of exposed material. At this time conductivity imparting dopants are implanted to form the lightly doped source/drain regions 42.

The sidewall spacers 24 are then formed by depositing a second insulator layer on the substrate surface that extends into the openings formed by the patterning of the layers 18, 20, and 22, and then anisotropically etching the insulating layers. The spacers 24 are typically silicon oxide or silicon nitride. A conductivity imparting dopant is then implanted through the openings defined by the spacers 24 to form heavily doped source/drain regions 14, as indicated in FIG. 9. A third insulating layer 32 is then deposited on the surface and an opening 44 made over region 14, using a rough mask to define the general region of the opening. This opening formed by anisotropic ion etching, is the self aligned contact (SAC) opening. As indicated in FIG. 9, the top surfaces of spacers 24 are further eroded, as indicated by dotted lines 46 that indicate the spacer 24 shape before the etch step. As is believed apparent, the undercuts 40 in layer 20 will increase the thickness of spacers 24 and thereby reduce the likelihood that a breakdown or short will develop between the contact and the gate electrode. Even though a metal silicon layer should develop during processing. it will form in the recess undercut 40. This will preserve a greater spacer 24 thickness in the critical region where it is thinned during the SAC etch.

In FIG. 10, there is shown the complete source/drain SAC structure consisting of a thin barrier layer of amorphous silicon or polysilicon 48 and a conductive layer 50, typically a doped polysilicon layer, or a metal silicide layer. The device is completed by depositing another dielectric layer, forming openings over the contact structures, and forming an interconnect metallization structure joining the contacts.

While this invention has been particularly shown and described with reference to the preferred embodiments thereof, it will be understood by those skilled in the art that various changes in form and details may be made without departing from the spirit and scope to this invention.

What is claimed is:

1. An improved method of fabricating a polycide self-aligned contact structure for MOSFET devices in a SRAM cell on a semiconductor substrate in which the electrical isolation between the contact and the gate structure is improved comprising;

forming a gate insulator layer on the semiconductor substrate, depositing a first polysilicon layer on said gate insulator layer, depositing a first metal silicide layer on said first polysilicon layer, depositing a first insulator layer on said first metal silicide layer.

patterning said first insulator layer by a first anisotropic etching, dip etching the exposed metal silicide layer in an isotropic etchant for metal silicide to form an undercut in only the top edge of the first metal silicide layer beneath the overlying edge of said first insulator layer, continuing the patterning of said first metal silicide layer and said first polysilicon layer by a second anisotropic etching, to form openings that define polycide gate structures on said gate insulator layer, ion implanting a first conductivity imparting dopant into said semiconductor substrate through said openings in regions not covered by said polycide gate structures to form lightly doped source and drain regions, depositing a second insulator layer on said substrate that extends into said openings formed by the patterning, and into said undercut in said metal silicide layer, anisotropically etching said second insulator layer to form sidewall spacers on the sides of said polycide gate structure, ion implanting a second conductivity imparting dopant into said semiconductor substrate to form heavily doped source and drain regions, depositing a third insulator layer, opening a hole in said third insulator layer thereby forming a self-aligned SAC opening and exposing said heavily doped source and drain regions in the space defined by said sidewall spacers, depositing a thin second polysilicon layer in contact with said heavily doped source and drain regions and said sidewall spacers, depositing a thin second metal silicide layer over said second polysilicon layer, patterning said second metal silicide layer and said second polysilicon layer to create a SAC structure.

2. The method of claim 1 which contains the further steps of completing the device structure by;

depositing a dielectric layer over the surface with openings over the contact structures, forming metal plugs in the openings, and forming an interconnect metallization structure joining said metal plugs.

3. The method of claim 2 wherein said first metal silicide layer is formed of tungsten silicide.

4. The method of claim 3 wherein said dip etchant removes approximately 300 Angstroms from the surface of said tungsten silicide layer.

5. The method of claim 4 wherein the undercut extends approximately 200 Angstroms into said tungsten silicide layer.

6. The method of claim 5 wherein said isotropic etchant for tungsten silicide is comprised of 1 part $NH_4OH$, 1 part $H_2O_2$, and 5 parts $H_2O$, by volume.

7. The method of claim 6 wherein said tungsten silicide layer is exposed to said etchant for a time in the range of 20 to 25 minutes.

8. The method of claim 7 wherein said etchant is maintained at a temperature in the range of 25 to 35 degrees C.

9. The method of claim 1 wherein first said metal silicide layer is tungsten silicide, deposited using LPCVD procedures at a temperature between 400 to 600 C., to a thickness between 750 to 1500 Angstroms, using silane and tungsten hexafluoride as a source.

10. The method of claim 9 wherein said polycide gate structures are patterned with an anistropic reactive ion etch (RIE), using $CHF_3$ as an etchant for said first insulator layer and using $CL_2$ as an etchant for said first metal silicide layer, and for said first polysilicon layer.

11. The method of claim 10 wherein said insulator spacers formed on said sides of said polycide gate structures are comprised of silicon nitride, deposited using LPCVD or plasma enhanced chemical vapor deposition procedures, to a thickness between 600 to 800 Angstroms, and etched with anisotropy RIE procedures, using $CHF_3$ as an etchant.

12. The method of claim 11 wherein said first insulator layer is silicon nitride having a thickness in the range of 2000 to 3000 Angstroms.

13. The method of claim 12 wherein said silicon nitride is reactively ion etched using $CHF_3$ as an etchant.

14. The method of claim 1 wherein said first insulator layer is silicon oxide.

* * * * *